United States Patent
Wang et al.

(10) Patent No.: US 8,598,742 B2
(45) Date of Patent: Dec. 3, 2013

(54) SERVER AND METHOD FOR DETECTING WORK STATE OF POWER TRANSFORMERS

(75) Inventors: Chi-Chih Wang, Taipei Hsien (TW); Bing-Yu He, Shenzhen (CN); Zhong-Gen Zhan, Shenzhen (CN); Wei Xiong, Shenzhen (CN)

(73) Assignees: GDS Software (ShenZhen) Co., Ltd, Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 281 days.

(21) Appl. No.: 12/965,915

(22) Filed: Dec. 12, 2010

(65) Prior Publication Data

US 2011/0254375 A1  Oct. 20, 2011

(30) Foreign Application Priority Data

Apr. 14, 2010 (CN) .......................... 2010 1 0146846

(51) Int. Cl.
  *H01F 30/12* (2006.01)
  *H02J 3/38* (2006.01)
(52) U.S. Cl.
  USPC ............... 307/83; 324/547; 322/22; 700/292

(58) Field of Classification Search
  USPC .................... 700/292; 705/305; 707/999.104; 324/547; 307/83, 125; 361/64
  See application file for complete search history.

(56) References Cited

U.S. PATENT DOCUMENTS

| | | | |
|---|---|---|---|
| 2009/0312880 A1* | 12/2009 | Venturini Cheim et al. | .. 700/292 |
| 2009/0312881 A1* | 12/2009 | Venturini Cheim et al. | .. 700/292 |
| 2011/0031980 A1* | 2/2011 | Kruger et al. | ........... 324/547 |

* cited by examiner

*Primary Examiner* — Rexford Barnie
*Assistant Examiner* — Jagdeep Dhillon
(74) *Attorney, Agent, or Firm* — Altis & Wispro Law Group, Inc.

(57) ABSTRACT

A server and method detects a power transformer. The server reads power transformer data from a data converter and determines if work state of a power transformer needs to be changed from based on the power transformer data. An alert message is generated by the server and sent to an alarm computer in response to a determination that the work state of the power transformer needs to be changed. The server saves the power transformer data into a database system.

15 Claims, 3 Drawing Sheets

SERVER AND METHOD FOR DETECTING WORK STATE OF POWER TRANSFORMERS

BACKGROUND

1. Technical Field

Embodiments of the present disclosure relate to detection technology, and particularly to a server and method for detecting work state of power transformers.

2. Description of Related Art

A power transformer is a device that transfers electrical energy from one circuit to another through inductively coupled conductors. An ideal power transformer would have no energy loss, and would be 100% efficient. In practice, the energy loss is consumed by parts of the power transformer such as the windings, core, and surrounding structures. The energy loss in the power transformers may cause a serious waste of resources. Reducing the energy loss in the power transformers can make the power transformers more efficient. Currently, power transformer detection for the energy loss depends on manual operation. For example, an engineer may inspect the power transformer by himself. However, the method may be time-consuming or imprecise.

DETAILED DESCRIPTION

All of the processes described below may be embodied in, and fully automated via, function modules executed by one or more general purpose processors of a computer. Some or all of the methods may alternatively be embodied in specialized hardware. The function modules may be stored in any type of computer-readable medium or other computer storage device.

As used herein, the term, "power transformer data" may be defined as data generated by a power transformer. The power transformer is a device that transfers electrical energy from one circuit to another through inductively coupled conductors which are called the power transformer's coils. Likewise, the term, "vacuum circuit breaker" may be defined as a device for acquiring the power transformer data from the power transformer. It may be understood that the term, "data" may refer to a single data item or may refer to a plurality of data items. These terms, with reference to the FIGS. 1-3, will be described in greater detail below.

Figure 1:
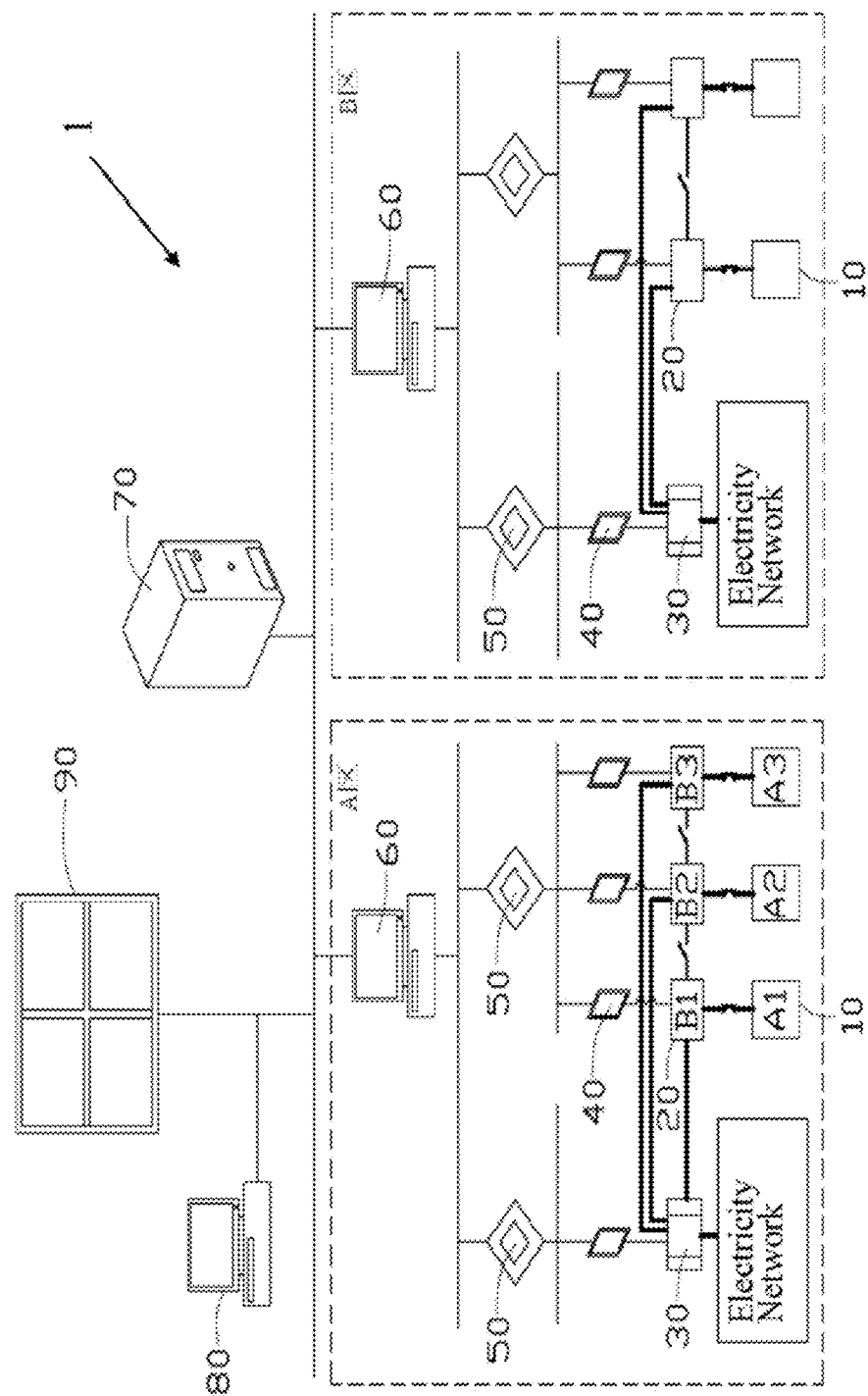
FIG. 1 is a systematic diagram of one embodiment of a power transformer detection system.

FIG. 1 is a systematic diagram of one embodiment of a power transformer detection system 1. The power transformer detection system 1 may automatically change the work state of the power transformers 10 in accordance with detected power transformer data. The work states of the power transformers 10 include a power-on state and a power-off state.

The power transformer detection system 1 includes one or more transformers 10 (e.g., A1, A2, A3), one or more vacuum circuit breakers 20 (e.g., B1, B2, B3), a switch 30, one or more electricity meters 40, one or more data converters 50, and a server 60 located in one or more areas, such as area A and B. Each area obtains the electricity from the electricity network via the switch 30. The switch 30 turns on or turns off an electrical connection between the area and the electricity network. The switch 30 may be, but is not limited to, a vacuum circuit breaker 20 or an electrical switch. The following description takes area A for example.

In some embodiments, each power transformer 10 connects to a vacuum circuit breaker 20, as shown in FIG. 1. The vacuum circuit breaker 20 turns on or turns off an electrical connection between the power transformer 10 and the vacuum circuit breaker 20 and acquires the power transformer data of the power transformer 10 (e.g., currents, voltages and powers). The current of the power transformer 10 is equal to the current of the vacuum circuit break 20 connected to the power transformer 10. For example, the current of A1 is equal to the current of B1. Additionally, two adjacent vacuum circuit breakers connect each other. For example, the area A includes three vacuum circuit breakers B1, B2, and B3, wherein B1 connects B2 and B2 connects B3. If B1 turns off the electrical connection with A1, the current from A1 flows to B2. Each of the vacuum circuit breakers 20 may include a communication unit for communicating with the electricity meter 40. For example, the communication unit may be a radio transceiver. In other embodiments, the vacuum circuit breaker 20 may communicate with the electricity meter 40 using an electrical cable.

The electricity meter 40 connects the vacuum circuit breaker 20 and the data converter 50. Furthermore, the electricity meter 40 collects the power transformer data from the vacuum circuit breaker 20 and sends the collected power transformer data to the data converter 50.

The data converter 50 converts the collected power transformer data into a data format (e.g., hexadecimal format) so that the server 60 can read the converted power transformer data via a network. In one embodiment, the network 20 may be a wide area network (e.g., the Internet) or a local area network.

The server 60 connects to the database system 70 using database connectivity interfaces, such as open database connectivity (ODBC) or java database connectivity (JDBC). In one embodiment, the server 60 may be a data processing device or a computing device such as a personal computer, an application server, or a workstation, for example.

The server 60 further connects to an alarm computer 80. The server 60 may process the detected power transformer data and determine if the work states of the power transformer 20 need to be change. In addition, the server 60 in other areas may be a backup server for each other. For example, if the server 60 in area A does not work, the server 60 in area B will automatically act as the backup server. Further details of the server 60 will be described below.

The alarm computer 80 connects to a display device 90 (e.g., a video wall) for notifying a user that the work state of the power transformer 10 needs to be changed from the power-on state to the power-off state. Depending on the embodiment, the alarm computer 80 may further connect to an alarm device (e.g., a buzzer or a warming light) for notifying the user. The alarm computer 80 may be a data processing device or a computing device such as a personal computer, an application server, or a workstation, for example.

Figure 2:
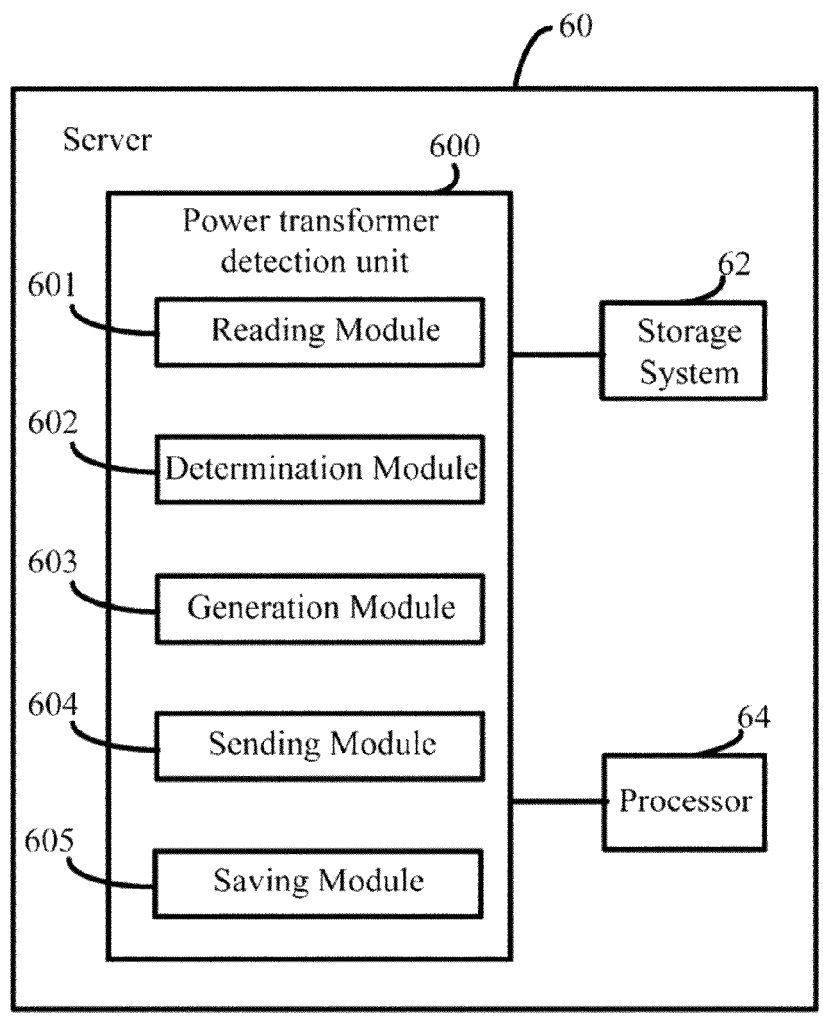
FIG. 2 is a block diagram of one embodiment of a server of the power transformer detection system in FIG. 1.

FIG. 2 is a block diagram of one embodiment of the server 60 including a power transformer detection unit 600. The power transformer detection unit 600 automatically collects the power transformer data and processes the power transformer data. In one embodiment, the power transformer detection unit 600 includes a reading module 601, a determination module 602, a generation module 603, a sending module 604, and a saving module 605. One or more computerized codes of the modules 601-605 are stored in a storage system 62 of the server 60. One or more general purpose or specialized processors, such as a processor 64, executes the computerized codes of the modules 601-605 to provide one or more operations of the power transformer detection unit 600. The storage system 62 may be a memory, a hard disk driver, or a cache.

The reading module 601 reads the power transformer data from the data converter 50. In one embodiment, the power transformer data include currents, voltages and powers. In addition, the power transformer data is collected at a predetermined interval. For example, the predetermined interval may be 5 minutes.

The determination module 602 analyzes the power transformer data to determine if the work state of the power transformer 10 needs to be changed from the power-on state to the power-off state. In one embodiment, the work state of the power transformer 10 needs to be changed upon the condition that a total current of two adjacent vacuum circuit breakers 20 is less than or equal to a predefined maximum current of one of the two adjacent vacuum circuit breakers 20. For example, if B1 and B2 are two adjacent vacuum circuit breakers 20, the total current of B1 and B2 is equal to the current of B1 plus the current of B2. It should be understood that the higher the current flows to the power transformer 10, the energy loss in the power transformer 10 will be lower.

The generation module 603 generates an alert message in response to a determination that the work state of the power transformer 10 needs to be changed from the power-on state to the power-off state. In some embodiments, the alert message includes a serial number of the power transformer 10, how to change the work state of the power transformer 10, and the reason to change the work state of the power transformer 10.

The sending module 604 sends the alert message to the alarm computer 80 to notify a user that the work state of the power transformer 10 need to be changed from the power-on state to power-off state. In one embodiment, the alarm computer 80 receives the alert message and sends the alert message to the user. For example, the alarm computer 80 sends an e-mail or a short message service (SMS) message to notify the user that the work state of the power transformer 10 needs to be changed from the power-on state to power-off state. In addition, the alarm computer 80 may display the alert message on the display device 90 after the alarm computer 80 receiving the alert message.

The saving module 605 saves the power transformer data into the database system 70. In one embodiment, the saving module 605 saves the currents, voltages and powers into the database system 70.

Figure 3:
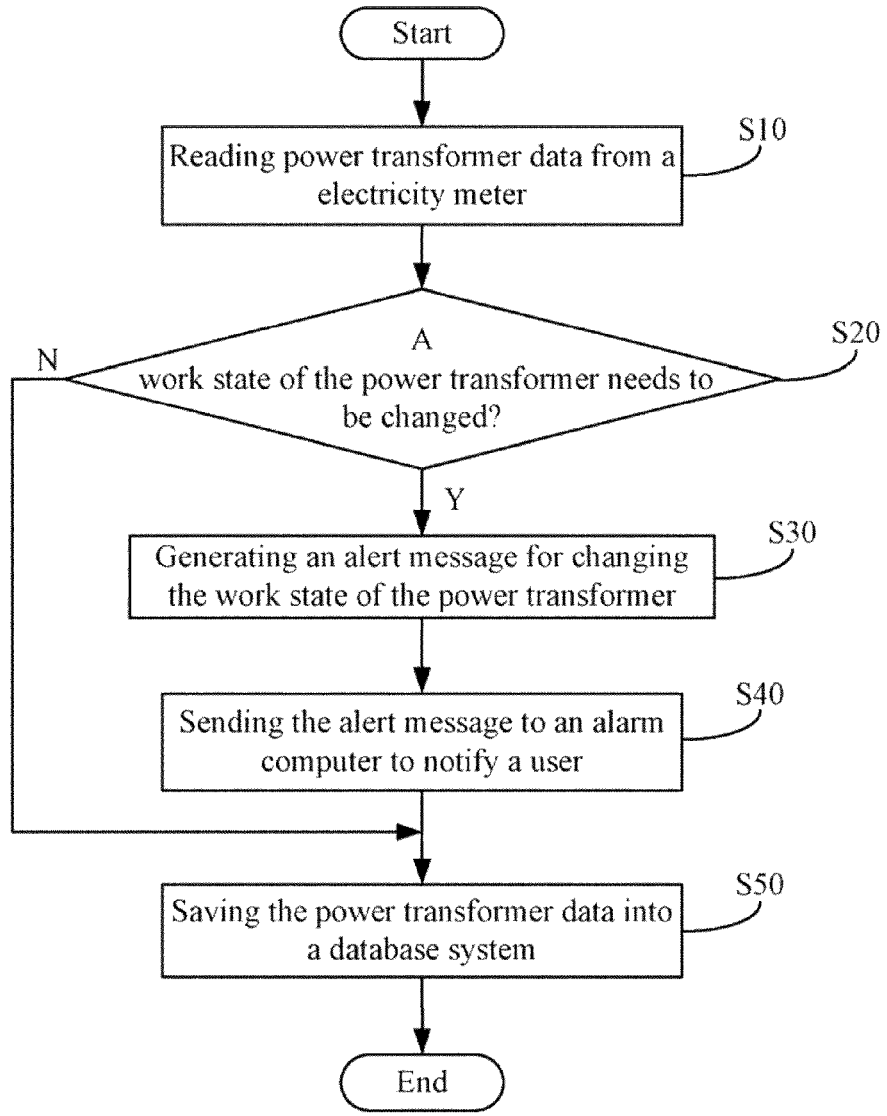
FIG. 3 is a flowchart of one embodiment of a method for detecting work state of a power transformer.

FIG. 3 is a flowchart of one embodiment of a method for detecting the power transformer 10. The method may be used to detect if the work state of the power transformer 10 needs to be changed. Depending on the embodiment, additional blocks may be added, others deleted, and the ordering of the blocks may be changed.

In block S10, the reading module 601 reads the power transformer data from the data converter 50. As mentioned above, the power transformer data includes currents, voltages and powers.

In block S20, the determination module 602 determines if the total current of the two adjacent vacuum circuit breakers 10 is less than or equal to a maximum current of one of the two adjacent vacuum circuit breakers 10. For example, if the maximum current of A1 or the maximum current of A2 is 500 Ampere (hereafter "A"), the current of A1 is 200 A, the current of A2 is 200 A. The total current of A1 and A2 is 400 A and is less than the maximum current of A1 or the maximum current of A2, the work state of A1 needs to be changed from the power-on status to the power-off status. A1 is turned off the electrical connection by B1. The procedure goes to block S30 upon the condition that the total current of the two adjacent vacuum circuit breakers 10 is less than or equal to the maximum current. The procedure goes to block S50 upon the condition that the total current of the two adjacent vacuum circuit breakers 10 is more than the maximum current.

In block S30, the generation module 603 generates an alert message upon the condition that the total current of the two adjacent vacuum circuit breakers 10 is less than or equal to the maximum current. The alert message includes a serial number of the power transformer 10, how to change the work state of the power transformer 10, and the reason to change the work state of the power transformer 10. For example, if the work state of the power transformer A1 needs to be changed from the power-on state to the power-off state, the generation module 603 generates an alert message as following: A1, turn off the electrical connection with A1 and establish the electrical connection between B1 and B2, and the utilization rate of A1 is low.

In block S40, the sending module 604 sends the alert message to the alarm computer 80 to notify a user. In one embodiment, the alarm computer 80 sends the alert message so that the user may be aware of the work state of the power transformer 10 quickly and easily. The alert message may be an e-mail or a short message service (SMS) message. In addition, the alarm computer 80 may display the alert message shown in the display device 90 upon receiving the alert message.

In block S50, the saving module 605 saves the power transformer data into the database system 70. In one embodiment, the user may set a scheduled time for starting a program for saving the power transformer data into the database system 70. For example, the user may set the time for starting the program at 9:00 A.M. If the current time is 9:00 A.M., the program for saving the power transformer data is executed.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A server in electronic communication with an electricity meter that measures current from a power transformer, comprising:
    a storage system;
    at least one processor; and
    a power transformer detection unit stored in the storage system and being executable by the at least one processor, the power transformer detection unit comprising:
    a reading module operable to read power transformer data from the electricity meters, the power transformer data comprising a current of the power transformer, the current of the power transformer being equal to the current of a vacuum circuit breaker connected to the power transformer;
    a determination module operable to determine if a work state of the power transformer needs to be changed from a power-on state to a power-off state upon the condition that a total current of two adjacent vacuum circuit breakers is less than or equal to a predefined maximum current of one of the two adjacent vacuum circuit breakers; and
    a sending module operable to send an alert message to an alarm computer in response to a determination that the work state of the power transformer needs to be changed from the power-on state to the power-off state.

2. The server of claim 1, wherein the power transformer data further comprises voltages and powers.

3. The server of claim 1, wherein the server further comprise a generation module operable to generate the alert message in response to a determination that the work state of the power transformer needs to be changed from the power-on state to the power-off state.

4. The server of claim 1, wherein the server further comprise a saving module operable to save the power transformer data into a database system.

5. The server of claim 1, wherein the reading module reads the power transformer data from the data converter at a predetermined interval.

6. A computer-based method for detecting work state of a power transformer, the method comprising:
reading power transformer data from electricity meters, the power transformer data comprising a current of the power transformer, the current of the power transformer being equal to the current of a vacuum circuit breaker connected to the power transformer;
determining if a work state of the power transformer needs to be changed from a power-on state to a power-off state upon the condition that a total current of two adjacent vacuum circuit breakers is less than or equal to a predefined maximum current of one of the two adjacent vacuum circuit breakers;
sending an alert message to an alarm computer in response to a determination that the work state of the power transformer needs to be changed from the power-on state to the power-off state.

7. The method of claim 6, wherein the power transformer data further comprises voltages and powers.

8. The method of claim 6, further comprising:
generating the alert message in response to a determination that the work state of the power transformer needs to be changed from the power-on state to the power-off state.

9. The method of claim 6, further comprising:
saving the power transformer data into a database system.

10. The method of claim 6, wherein the power transformer data is read from the data converter at a predetermined interval.

11. A non-transitory computer-readable medium having stored thereon instructions that, when executed by a computing device, causing the computing device to perform a method for detecting a power transformer, the method comprising:
reading power transformer data from electricity meters, the power transformer data comprising a current of the power transformer, the current of the power transformer being equal to the current of a vacuum circuit breaker connected to the power transformer;
determining if a work state of the power transformer needs to be changed from a power-on state to a power-off state upon the condition that a total current of two adjacent vacuum circuit breakers is less than or equal to a predefined maximum current of one of the two adjacent vacuum circuit breakers;
sending the alert message to an alarm computer in response to a determination that the work state of the power transformer needs to be changed from the power-on state to the power-off state.

12. The medium of claim 11, wherein the power transformer data further comprises voltages and powers.

13. The medium of claim 11, the method further comprising:
generating the alert message in response to a determination that the work state of the power transformer needs to be changed from the power-on state to the power-off state.

14. The medium of claim 11, the method further comprising:
saving the power transformer data into a database system.

15. The medium of claim 11, wherein the power transformer data is read from the data converter at a predetermined interval.

* * * * *